(12) United States Patent
Watanabe et al.

(10) Patent No.: US 7,052,547 B2
(45) Date of Patent: May 30, 2006

(54) APPARATUS FOR SUPPLYING RAW MATERIAL

(75) Inventors: Hideki Watanabe, Tokyo (JP); Hiroshi Asano, Tokyo (JP); Masakazu Onishi, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/890,380

(22) Filed: Jul. 14, 2004

(65) Prior Publication Data

US 2005/0045093 A1 Mar. 3, 2005

(30) Foreign Application Priority Data

Jul. 15, 2003 (JP) .............................. 2003-197206

(51) Int. Cl.
*C30B 25/12* (2006.01)
*C30B 25/14* (2006.01)

(52) U.S. Cl. ...................... 117/200; 117/18; 117/213; 117/214

(58) Field of Classification Search ................. 117/18, 117/213, 214, 200
See application file for complete search history.

(56) References Cited

U.S. PATENT DOCUMENTS

| | | | | |
|---|---|---|---|---|
| 5,324,488 A | * | 6/1994 | Klingshirn et al. | 117/213 |
| 5,587,016 A | * | 12/1996 | Altekruger et al. | 117/214 |
| 5,868,835 A | * | 2/1999 | Nagai et al. | 117/201 |
| 6,805,746 B1 | * | 10/2004 | Moroishi et al. | 117/214 |

* cited by examiner

*Primary Examiner*—Felisa Hiteshew
(74) *Attorney, Agent, or Firm*—Morrison & Foerster LLP

(57) ABSTRACT

In single crystal growth by means of a CZ method, a granular/lump polycrystalline raw material is additionally supplied into a raw material melt in a crucible through a vertical charging tube. A raw material accumulating section is provided at a site part way downward in the vertical charging tube working in such a way that a predetermined amount of the polycrystalline raw material is accumulated in the raw material accumulating section and the polycrystalline raw material in excess of the predetermined amount falls down. The polycrystalline raw material falling down in the vertical charging tube strikes against the accumulated raw material in the raw material accumulating section, thereby absorbing a shock of the falling raw material. The accumulated raw material works simultaneously as a protective member, thereby preventing breakage of the tube accompanying absorption of the shock from occurring. It is therefore possible to prevent melt splashing that is problematical when a lump raw material for recharge is charged using a vertical charging tube.

6 Claims, 6 Drawing Sheets

No accumulated raw material    With accumulated raw material

F I G 4
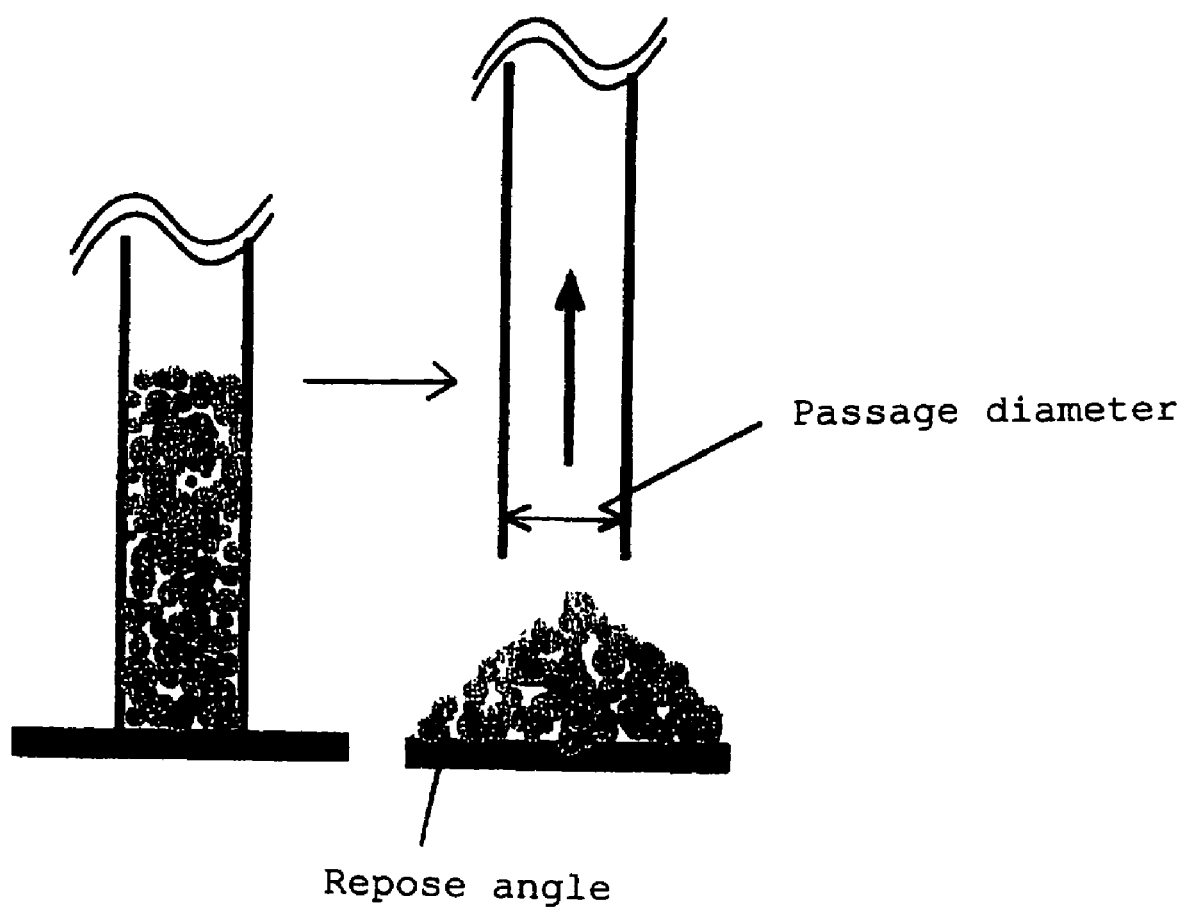

APPARATUS FOR SUPPLYING RAW MATERIAL

BACKGROUND OF THE INVENTION

1. Field of the Invention

The present invention relates to an apparatus for supplying raw material used in single crystal growth by means of a CZ method, and more particularly, to an apparatus for supplying raw material used in charging granular/lump polycrystalline raw material into a crucible.

2. Description of the Background Art

A silicon single crystal, which serves as a material of a semiconductor device, is exclusively used by means of a CZ method for the industrial purpose. In single crystal growth by means of a CZ method, solid poly-silicon initially charged in a crucible is molten by heating with a heater. When a raw material melt is formed in such a way in the crucible, a seed crystal is dipped into the raw material melt in the crucible and starting in this state, the seed is raised while rotating the seed and the crucible, thereby growing a silicon single crystal in the shape of a cylinder at and below the lower end of the seed. As a solid raw material initially charged in the crucible, there are used cut rods, lumps, granules and others of the poly-silicon, either alone or in combination.

In such single crystal growth by means of a CZ method, multipulling-up has been conceived for the purpose to reduce a crucible cost and others. This is a technique in which after a single crystal is pulled up, a solid raw material is additionally charged into a remaining raw material melt in the crucible to thereby again form a raw material melt at the same amount as when the solid raw material is initially charged in the crucible, which is followed by repetition of pulling-up of a single crystal with the result of an increased number of pulling-up times per one crucible. In this technique, additional charge of a solid raw material is called recharge. Techniques to recharge cut rods are described in Patent JP B 94(H6)-31193 and JP A 96(H8)-310892, and techniques to recharge a granular raw material are described in JP A 87(S62)-260791, JP A 96(H8)-143392 and JP A 97(H9)-227288.

Since not only are cut rods higher in unit price by weight as compared with that of a granular raw material, but mechanical processing at an end portion of a cut rod is also necessary in order to hang down the cut rod above a crucible, leading to a considerably high cost in total. Therefore, it is recommended to use a granular raw material from the viewpoint of cost effectiveness. A granular raw material has, however, a larger surface area. A problem has also arisen that an oxide film formed on a larger surface area of the granules is burst in a raw material melt when a raw material is charged and not only is splashed melt attached onto constituent members to be a solid matter, but the attached solid matter falls off onto the surface of the melt to cause crystal defects such as dislocations in a growing crystal.

Judging from the circumstances described above collectively, a lump material, which is larger in size of each piece than a granular raw material, can be expected as a lower cost recharge raw material as replacement for cut rods. Since not only is a lump raw material as low in cost as a granular raw material, but the surface area of a lump raw material less than a granular raw material, no problem of the splashing occurs. A lump raw material, however, does not necessarily have any problem. In a case of a lump raw material, the following problem has arisen with respect to a raw material supply apparatus.

A necessity arises for a granular raw material to be guided into a crucible using a charging tube when the granular raw material is additionally charged into a remaining melt in the crucible. As charging tubes, there are available an inclined charging tube installed obliquely downward from above a crucible and a vertical charging tube installed vertically from right above the crucible. In a most recent pulling furnace, arrangement of the inclined charging tube causes a problem of interference with many of accessory members such as a heat shielding member above the crucible because of the presence thereof. Hence, additional charge of the granular raw material can be said to be desirably conducted with the vertical charging tube as the latter choice in the central section of the crucible.

In additional charging of a lump raw material using the vertical charging tube, melt splashing caused by the raw material is problematical, however. This is because a lump raw material is heavier than a granular raw material and, in a case of the vertical charging tube, a falling speed is larger in the vertical charging tube than in the inclined charging tube, so kinetic energy is increased when being charged.

As a measure for decreasing kinetic energy, when a lump raw material is charged, down to a level at which melt splashing is not problematical, it is conceived to bend the vertical charging tube at a site thereof part way downward. If the vertical charging tube is bent between both ends thereof, a falling raw material strikes against the bent portion to release part of kinetic energy to thereby decrease energy when being charged. A vertical charging tube is, however, made from a quartz pipe from the viewpoint of contamination. Moreover, a quartz pipe is low in mechanical strength; therefore, wear loss or breakage thereof occurs in the bent portion against which a falling raw material strikes.

SUMMARY OF THE INVENTION

It is an object of the present invention to provide an apparatus for supplying a raw material, capable of preventing melt splashing that is problematical when a lump raw material is charged using a vertical charging tube, and causing neither wear loss nor breakage of the vertical charging tube, which might occur locally.

In order to achieve the object, a raw material supply apparatus, for additionally supplying a granular/lump polycrystalline raw material into a raw material melt in a crucible through a vertical charging tube in single crystal growth by means of a CZ method, comprises a raw material accumulating section working in such a way that a predetermined amount of the polycrystalline raw material is accumulated in the raw material accumulating section at a site part way downward in the vertical charging tube and the polycrystalline raw material in excess of the predetermined amount falls down.

According to the present invention, the vertical charging tube is used, thereby enabling interference with accessory members above a crucible to be avoided. By striking of a raw material falling down in the vertical charging tube against the accumulated raw material at a site part way downward of the tube, kinetic energy of a falling raw material is absorbed, which alleviates melt splashing when even a lump raw material is charged into a raw material melt in the crucible. In addition, the accumulated raw material serving as a cushion (a shock reducing material) and therefore, the vertical charging tube is mechanically protected, thereby preventing wear loss or breakage breakage of the tube.

A polycrystalline raw material is preferably a lump raw material having a particle diameters of 30 mm or less. Since a lump raw material is less in surface area than a granular raw material, it is possible to solve problems such as splashing caused by an oxide on the surface. By limiting particle diameters to 30 mm or less, scaling-up of a facility is avoided. That is, if particle diameters exceeds 30 mm, an opening diameter of a charging tube or the like is required to be larger in order to charge the raw material without causing clogging, which necessitates scaling-up of the facility, leading in turn to difficulty in handling. Note that the lower limit of particle diameters of a lump raw material is 5 mm.

A raw material supply apparatus of the present invention is preferably of a construction in which the apparatus is connected to a top chamber of a CZ pulling furnace instead of a pull chamber. Effects of the construction are that an opening section of the top chamber can be used as a raw material charging port, which makes it unnecessary to provide a new raw material charging port on the furnace and that a single raw material supply apparatus can be used in common for all CZ pulling apparatuses.

The vertical charging tube is preferably of a construction in which the apparatus has a tubular guide section guiding discharged raw material from a raw material accumulating section at the side downstream therefrom. With this construction adopted, a scattering range of the charged raw material can be restricted to a small area. The guiding section may be either a vertical tube or an inclined tube. In any of both cases, the section is preferably a long tube protruding a length downward from the raw material accumulating section. The reason therefor is that the scattering range of the charged raw material can be restricted to a small one. In a case of an inclined tube, needless to say that an inclination angle thereof is necessary to be larger than a repose angle of the used raw material. A vertical charging tube can have raw material sections at plural sites in the length direction. With such a construction adopted, a falling energy of the raw material can be absorbed effectively.

BRIEF DESCRIPTION OF THE DRAWINGS

FIG. 4 is a view showing an outline of a passage diameter and repose angle recognition test of a lump raw material;

DESCRIPTION OF THE PREFERRED EMBODIMENT

Figure 1:
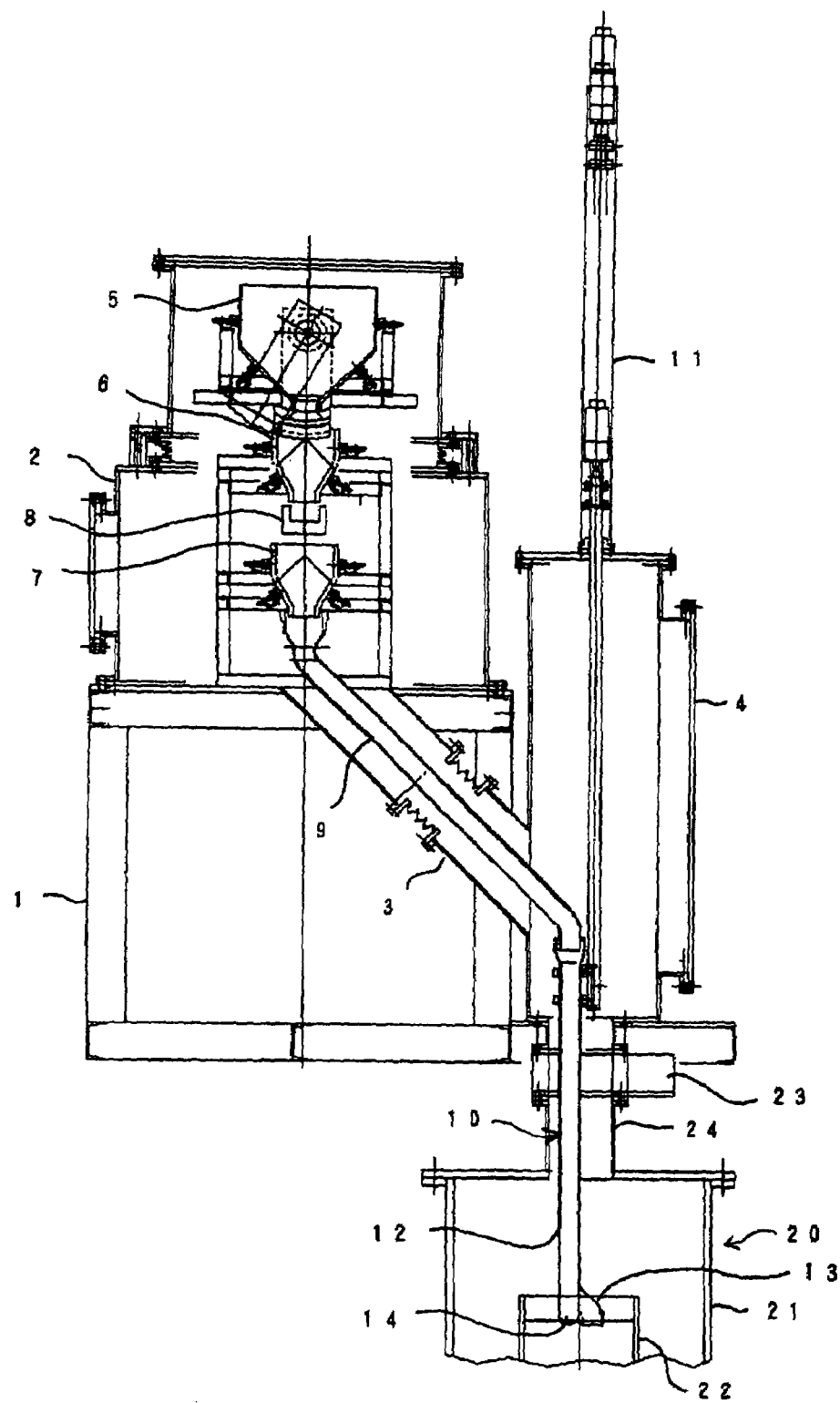
FIG. 1 is a view of the construction of a raw material supply apparatus showing an embodiment of the present invention.
Figure 2:
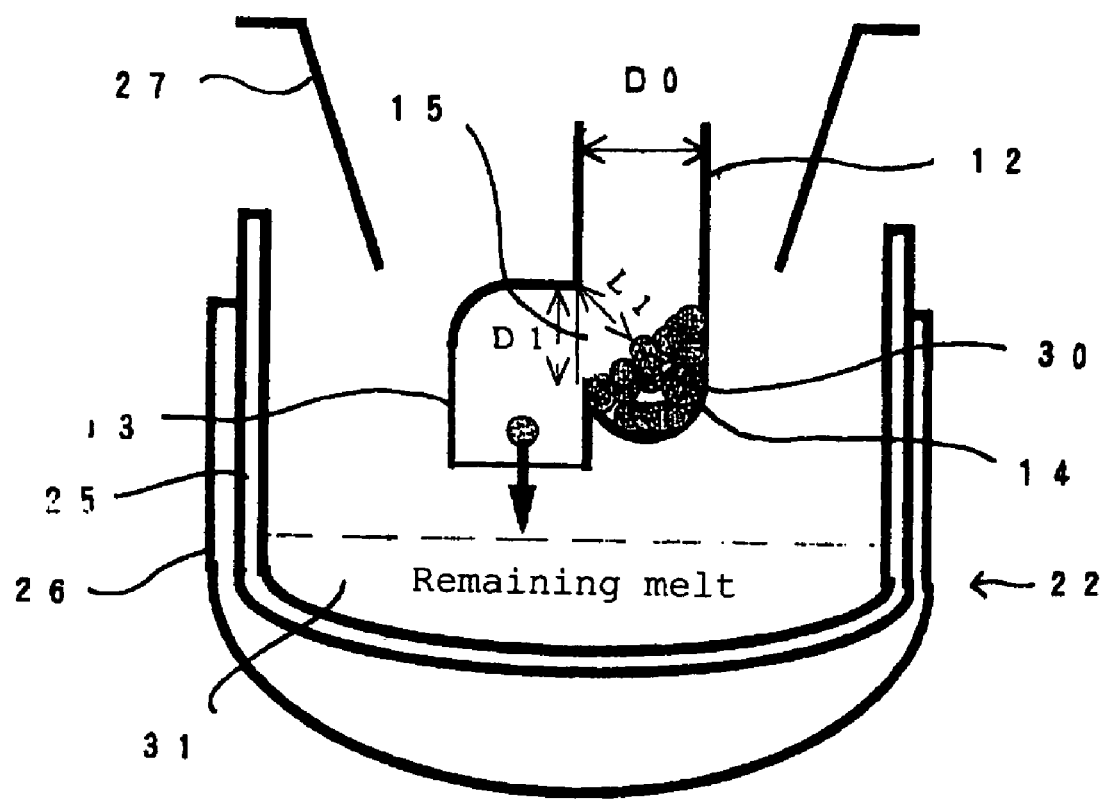
FIG. 2 is a longitudinal sectional view of a main section of the raw material supply apparatus.

Description will be given of an embodiment of the present invention below based on the accompanying drawings. FIG. 1 is a view of the construction of a raw material supply apparatus showing an embodiment of the present invention and FIG. 2 is a longitudinal sectional view of a main section of the raw material supply apparatus.

A raw material supply apparatus of this embodiment is of a transportable type moving in both ways between a position above a CZ pulling furnace 20 and a retreat place to a side thereof and connected to a top chamber 24 on a main chamber 21 instead of a pull chamber when in recharge and thereby, a polycrystalline raw material, especially a lump raw material having a particle diameter of 30 mm or less, is automatically charged into a crucible 22 in the main chamber 21.

The transportable raw material supply apparatus has a first chamber 2 mounted on a moving frame 1 and a second chamber 4. The second chamber 4 communicates with a side of the first chamber 2 via a connecting tube 3.

In the first chamber 2, a first hopper 5, a second hopper 6 and a third hopper 7 are arranged in the order from above to below and a metering feeder 8 is disposed between the second hopper 6 and the third hopper 7. The first hopper 5 is a raw material hopper. The bottom has a tapered surface with an inclination angle of 45 degrees or more in section and the discharging port provided in the central portion is opened or closed by a cut gate in a conical shape made of poly-silicon. The bottoms of the other hoppers each also have a tapered surface with an inclination angle of 45 degrees or more in section in a similar way to that in the first hopper 5. Cut gates thereof each also in a conical shape with an inclination angel of 45 degrees or more in section.

The connecting tube 3 is an inclined pipe directed downward to the second chamber 4 from the first chamber 2 and an inclined charging tube 9 is accommodated in the interior thereof. The inclined charging tube 9 guides a raw material to the vertical charging tube 10 described later, disposed at the downstream side of the third hopper 7. An inclination angle of the inclined charging tube 9 is also 45 degrees or more.

The second chamber 4 is a closed vessel in a cylindrical shape accommodating the vertical charging tube 10 connected to the side downstream from the inclined charging tube 9. The chamber 4 is connected to the top chamber 24 provided with a gate valve 23 of the CZ pulling furnace 20. A driving mechanism 11 performing a vertical motion and rotation of the vertical charging tube 10 is provided on the chamber 4. The driving mechanism 11 works so as to insert the vertical charging tube 10 into the main chamber 21 of the CZ pulling furnace 20 from the second chamber 4 to thereby in turn insert the lower end portion of the vertical charging tube 10 into the crucible 22.

The vertical charging tube 10 is constructed with the inclined charging tube 9 and a quartz tube. The charging tube 10, as shown in FIG. 2, includes: a body section 12 positioned vertically and having the closed lower end and a guide section 13 connected in parallel to the lower end portion of the body section 12. The lower end portion of the body section 12 works as a raw material accumulating section 14 accumulating a lump raw material 30. The guide section 13 is a vertical pipe having the open lower end and the closed upper end and connected to a side surface of the tube body section 12 via a discharging port 15. The lower end of the guide section 13 protrudes a length downward from the lower end of the raw material accumulating section 14.

The raw material accumulating section 14 has the surface of the lower end swelling in the shape of a dome convex downward, accumulates a lump raw material 30 falling down through the body section 12 to a predetermined amount and the falling-down lump raw material 30 in excess of the predetermined amount is caused to sequentially flow out through the discharging port 15 into the guide section 13 and to thereby discharge the lump raw material 30. The reason why the lower end surface of the raw material accumulating section 14 is formed in the shape of a dome is that breakage due to stress concentration during heating is prevented from occurring. If the lower end surface was constituted a surface with an angular section, the raw material accumulating section 14 would have a danger of breakage at the angular portion. A global surface of the accumulated raw material in the raw material accumulating section 14 assumes a slope inclined downward toward the discharging port 15 and the inclination angle of the slope is a so-called repose angle. In order to cause the raw material to flow out smoothly from the raw material accumulating section 14 to the guide section 13, a distance L1 from the slope to the upper end of the discharging port 15, and a diameter D1 of the discharging port 15 are set to a value equal to or larger than an inner diameter D0 of the vertical charging tube 10.

The crucible 22 has a double structure of a quartz crucible 25 in the inner side and a graphite crucible 26 in the outer side combined. A heat shielding member 27 in the shape of an inverted frustum of cone is disposed concentrically above the crucible 22. The raw material supply apparatus of this embodiment is constructed such that the vertical charging tube 10 is inserted into the central section of the crucible 22 through the inside of the heat shielding member 27 to thereby supply the lump raw material 30 to a raw material melt 31 remaining in the crucible 22.

Then, description will be given of a raw material supply method using the raw material supply apparatus of this embodiment.

Pulling-up of a single crystal is conducted according to a common procedure in a state where a pull chamber not shown is connected onto the top chamber 24 of the CZ pulling furnace 20. When the pulling-up of a single crystal ends, the single crystal is moved into the pull chamber to close the gate valve 23 in the top chamber 24 and thereafter, the pull chamber is separated from the top chamber 24.

The raw material supply apparatus of this embodiment is, during a pulling-up operation, fixed at a retreat position not interfering with the pull chamber. If the pulling-up ends and the pull chamber is separated, the raw material supply apparatus of this embodiment moves from the retreat position to a supply position above the CZ pulling furnace 20. With such operations applied, the second chamber 4 of the raw material supply apparatus moves above the top chamber 24 and connected thereto.

When the second chamber 4 and the top chamber 24 have been connected to each other, a pressure in the interior of the chamber of the raw material supply apparatus is reduced to the same pressure as in the CZ pulling furnace 20 to then replace the existing atmosphere with an argon atmosphere. Then, the gate valve 23 in the top chamber 24 is opened. With such operations adopted, the raw material apparatus and the CZ pulling furnace have been connected to each other.

When connection between the CZ pulling furnace 20 and the raw material supply apparatus is completed, the vertical charging tube 10 in the second chamber 4 is moved down. By doing so, the vertical charging tube 10 is inserted into the central section of the crucible 22 placed in the main chamber 21 of the CZ pulling furnace 20. Moreover, the vertical charging tube 10 is connected to the downstream side of the inclined charging tube 9.

When setting of the vertical charging tube 10 ends, the lump raw material 30 accommodated in the first hopper 5 in the first chamber 2 is cut out into a predetermined amount (for example 5 kg). The lump raw material 30 cut out from the first chamber 2 is supplied to the third hopper 7 at a predetermined rate (for example, 500 g/min) via the second hopper 6 and via the cutting metering feeder 8. The lump raw material 30 supplied into the third hopper 7 is charged into the crucible 22 via the inclined charging tube 9 and via the vertical charging tube 10. With repetition of such operations, the lump raw material 30 at a predetermined amount (of, for example, 100 kg) into the remaining melt 31 in the crucible 22 from the first hopper 2 in the raw material supply apparatus.

When additional supply of the lump raw material 30 ends, the gate valve 23 is closed, the raw material supply apparatus is separated from the CZ pulling furnace 20 and instead, the pull chamber is connected to conduct the second pulling-up.

In pulling up a silicon single crystal of 200 mm in diameter and 1600 mm in length, recharge was conducted by the raw material supply method to perform 2 time multi-pulling-up. A diameter of a used quartz crucible was 24 inch and an initial charge amount was 140 kg, a recharge amount was 110 kg, a furnace pressure was in the range of from 30 to 60 torr and an argon gas flow rate was 160 l/min. In order to investigate contamination from the raw material supply apparatus and an influence thereof, DF percentages in pulling-up and amounts of impurities were observed and measured. Results of the evaluation are shown in Table 1.

TABLE 1

Results of DF and quality recognition test

| Test examples | DF states | Remaining melt impurity analysis (ppbw) | | | | |
|---|---|---|---|---|---|---|
| | | Cu | Fe | Cr | Ni | Zn |
| Comparative Example 1 | All DF | 2.4e−4 | 3.8e−5 | <5.6e−6 | <3e−5 | <5e−6 |
| Example 1 | All DF | 3.6e−4 | 3.3e−5 | <2.8e−6 | <3e−5 | <5e−6 |
| Example 2 | All DF | 4.2e−4 | 3.1e−5 | <4.6e−6 | <3e−5 | <5e−6 |
| Example 3 | Defects started at 1500 L | 2e−4 | 3.9e−5 | <5.2e−6 | <3e−5 | <5e−6 |
| Example 4 | All DF | 2.9e−4 | 2.2e−5 | <4.2e−6 | <3e−5 | <5e−6 |
| Example 5 | All DF | 4.1e−4 | 3.0e−5 | <1.8e−6 | <3e−5 | <5e−6 |

The comparative example in Table 1 is a case where a single crystal was pulled up from only an initial raw material (without recharge). Examples 1 to 5 are cases where after a single crystal of 110 kg was pulled up from a initial charge 140 Kg, 110 kg was recharged to pull up a second single crystal. No difference was observed in DF percentage and amounts of impurities between the cases where recharge was conducted and the case where no recharge was conducted, whereby no presence was recognized of metal contamination to be caused by the raw material supply apparatus.

Great advantage in use of the raw material supply method is obtained as follows. By using the vertical raw material supply apparatus 10, central charging without interference with a heat shielding member and others can be ensured. By using a lump raw material less in surface area than a granular raw material, splashing caused by an oxide film on the surfaces of the raw material is prevented. Despite of use of the vertical charging tube for charging a lump raw material high in falling impact, melt splashing is alleviated by using a raw material accumulating section to thereby suppress tube breakage and wear loss accompanying shock absorption. By adopting a construction in which a raw material charging tube is separately divided into an inclined pipe and a vertical pipe, facilitation is realized of disassembly and realization of lighter weight of a facility, and maintenance of parts (including cleaning, exchange and others).

Note that while in the embodiment described above, the raw material accumulating section 14 is provided at the lower end portion of the vertical charging tube 10, the section may be provided in the intermediate portion thereof. From the viewpoint of prevention of melt splashing, it is preferable to provide the raw material accumulating section 14 at the lowest possible site of the vertical charging tube 10. The raw material accumulating sections 14 can be provided in plural sites of the vertical charging tube as described above. In a case where the raw material charging sections are provided at plural sites, the raw material charging section 14 at the lowest level is preferably at the lowest possible site of the vertical charging tube 10. The guide section 13 located at and below the plural raw material accumulating section 14, if disposed in the same direction, the center line of the vertical charging tube 10 is displaced sideways together with the guide section. Hence, the guide sections 13 are disposed in alternate different directions so that the central line of the vertical charging tube 10 maintains a straight line across all the length thereof.

Then, description will be given of results of investigation about various kinds of factors related to a method and apparatus for supplying a raw material of the present invention.

Figure 3:
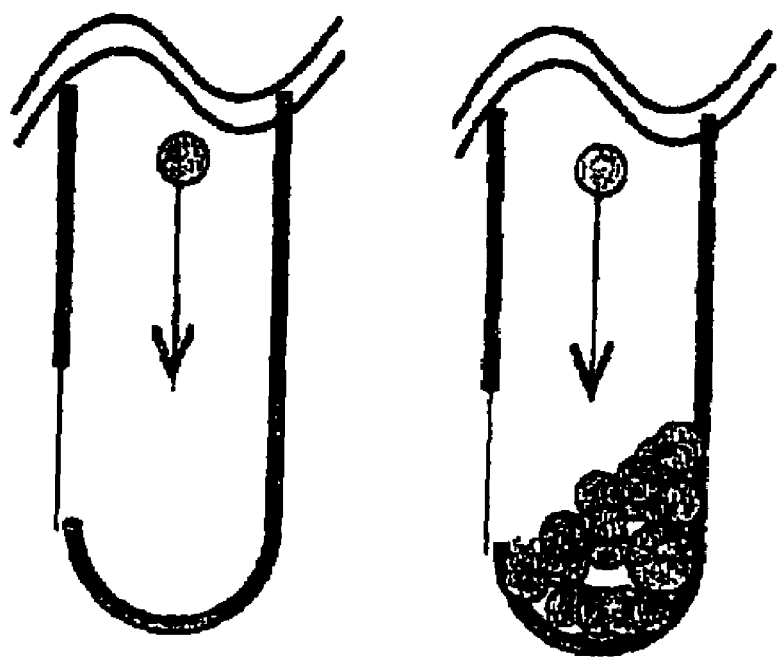
FIG. 3 is a view showing an outline of a strength test of a raw material accumulating section.

Firstly, investigation was conducted about durability of a raw material accumulating section formed at the lower end portion of the vertical charging tube. An outline of the investigation is shown in FIG. 3. Results of the investigation are shown in Table 2. In a case without an accumulated raw material, wear loss (scraping) increases with increase in charging amount of raw material and the tubes were broken and fall off at charging amounts of 7.5 kg and 12.5 kg. On the other hand, in a case with an accumulated raw material, raw material accumulating sections were protected by the accumulated raw material and neither wear loss nor breakage was recognized after charging of 100 kg. It is found from the results that the shock absorbing section of a charging tube is effectively protected by raw material accumulation.

TABLE 2

Results of durability tests on lower end portion of vertical charging tube

| Test examples | Presence/absence of accumulated raw material | Supply amount (kg) | Results |
| --- | --- | --- | --- |
| Example 1 | Absent | 1 | No breakage with wear loss |
| Example 2 | Absent | 7.5 | Broken and falling off |
| Example 3 | Absent | 12.5 | Same the above |
| Example 4 | Present | 1 | Neither broken nor worn |
| Example 5 | Present | 10 | Same the above |
| Example 6 | Present | 100 | Same the above |

Secondly, investigation was conducted about an inner diameter of a charging tube at which no clogging occurs when a lump raw material having a particle diameter of 30 mm or less. In addition, investigation was conducted about a repose angle of the lump raw material. An outline of the investigation is shown in FIG. 4. Results of the investigation are shown in Table 3. In the investigation, charging tubes having various inner diameters were erected on a plate and the tubes were raised by hand each in a state where a lump raw material was loaded therein. A vertical charging tube with an inner diameter of 80 mm or less had a danger of clogging. Repose angles in cases of vertical charging tubes each having an inner diameter of 85 mm or more at which each has no danger of clogging, were 41.1 degrees and 42.3 degrees. The following were found from the above results of the investigation. An inner diameter and an opening diameter in a case where the raw material is used are necessary to be 85 mm or more. Furthermore, an angle at a site where a raw material is slipped down is necessary to be 45 degrees or more.

TABLE 3

Results of charging tube inner diameter and repose angle recognition test

| Test examples | Quarts tube diameter | Presence/absence of clogging | Repose angle |
| --- | --- | --- | --- |
| Example 1 | 50 | Present | — |
| Example 2 | 60 | Present | — |
| Example 3 | 70 | Present | — |
| Example 4 | 80 | Present | — |
| Example 5 | 85 | Absent | 42.3 |
| Example 6 | 90 | Absent | 41.1 |

Figure 5:
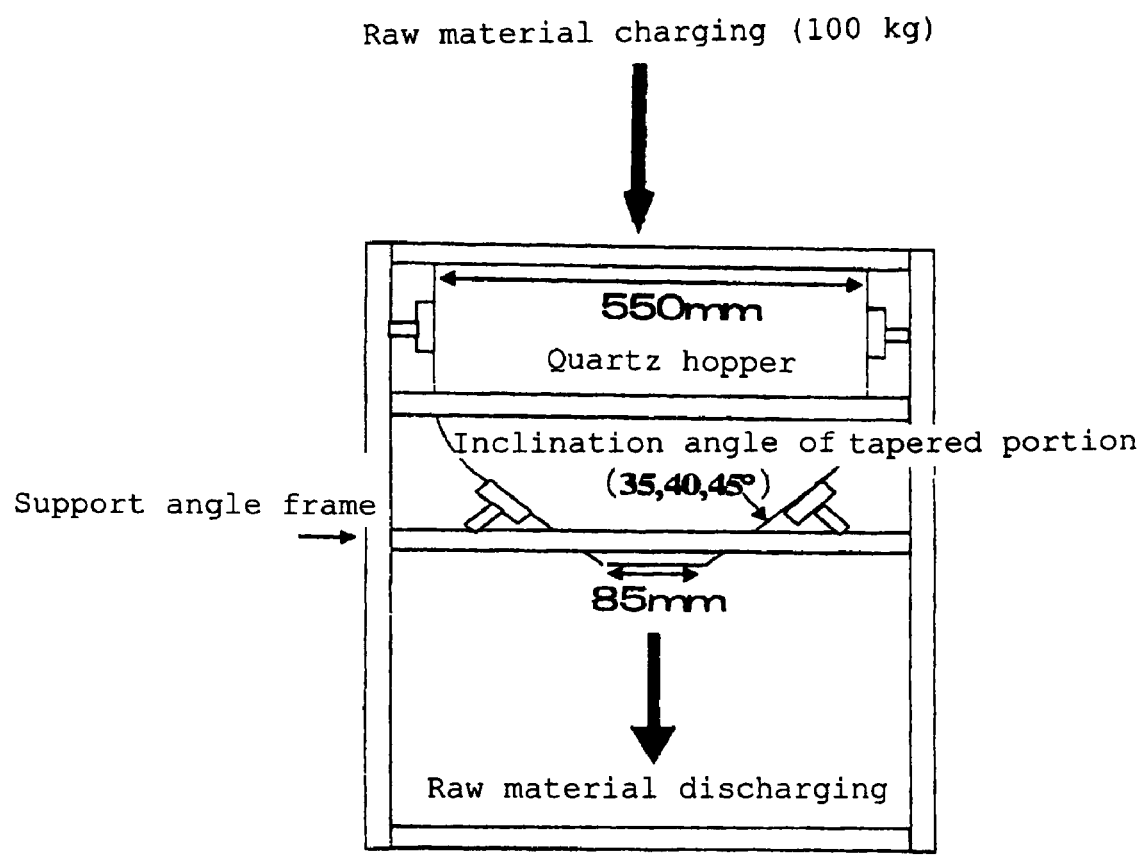
FIG. 5 is a view showing an outline of a test for investigation about an influence of an inclination angle of the tapered portion of a hopper.
Figure 6:
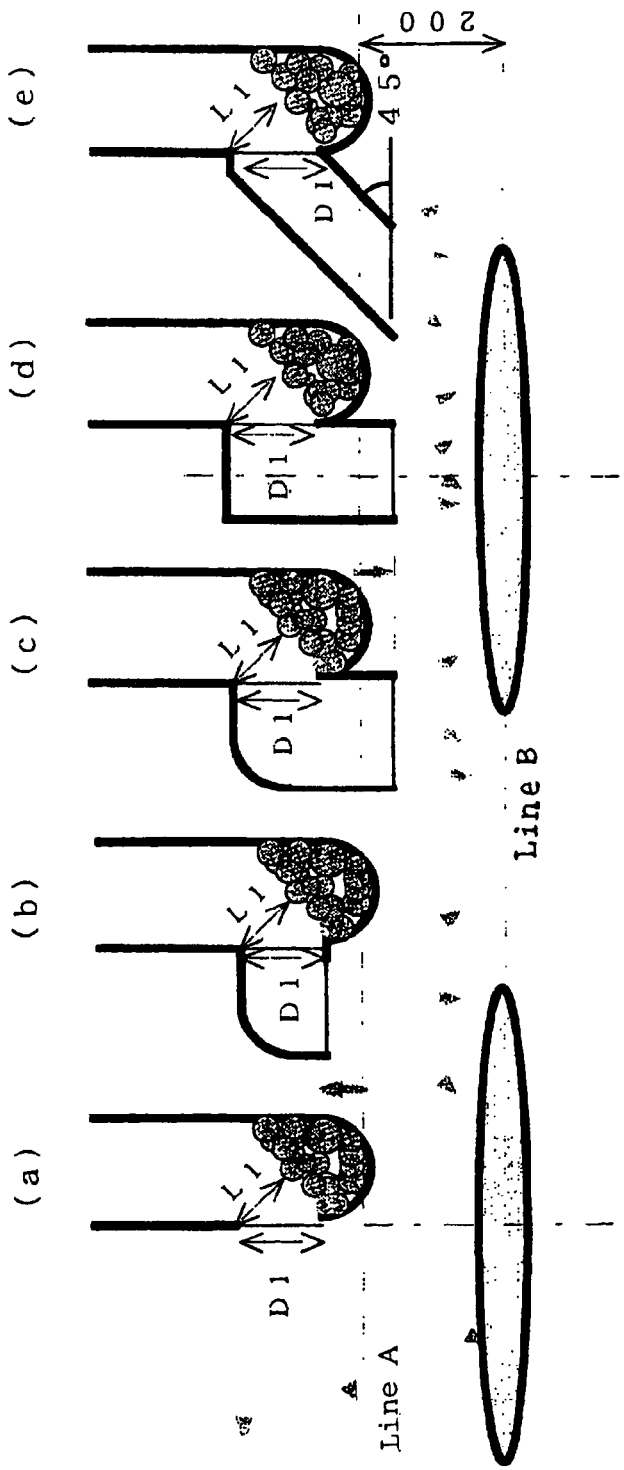
FIGS. 6A to 6E are model views showing example structures in the vicinity of raw material accumulating sections.

Thirdly, a discharging port diameter of a hopper was set to 85 mm in consideration of the results of the second investigation. An investigation was conducted about an influence of an inclination angle of the tapered portion of a hopper on discharging of a raw material. An outline of the investigation is shown in FIG. 5. Results of the investigation are shown in Table 4. There is a danger of clogging at an angle of 40 degrees or less. Therefore, an inclination angle of the tapered portion of 45 degrees or more is necessary in order to discharge all the raw material in the hopper without causing clogging (bridging) thereof. This result coincides with the results of the investigation on a repose angle. This result reflects on selection of 45 degrees or more as the inclination angle of the inclined charging tube in the embodiment, the inclination angle of the tapered portion of each of the hoppers and the inclination angle of the cut gates and others.

TABLE 4

Results of best inclination angle of tapered portion recognition test at discharging port diameter of 85 mm

| Test examples | Inclination of tapered portion | Presence/absence of clogging |
| --- | --- | --- |
| Examples 1 | 35 | Present |
| Examples 2 | 40 | Present |
| Examples 3 | 45 | Absent |

Fourthly, investigation was conducted about an influence of a shape of a guide section attached to a raw material accumulating section of a vertical charging tube. To be concrete, investigation was conducted about a scattering range of a raw material and presence or absence of attachment of a melt to a member. In FIGS. 6A to 6E, there are shown the structures in the vicinity of the raw material accumulating sections of the vertical charging tubes to be investigated. Results of the investigation are shown in Table 5. A scattering range is expressed with the maximum scattering distance (a distance in the horizontal direction) from the center of a guide section, if any, as the center of the scattering range, while in a case without a guide section, a scattering range is expressed by the maximum scattering distance from the outlet position of a raw material accumulating section as the center of the scattering range.

TABLE 5

Results of scattering-preventive tube effect recognition test

| Examples (with symbols in FIGS. 6A to 6E) | Scattering range (radius) | Presence/absence of melt attached to member | Others |
|---|---|---|---|
| Shape a | >300 | Present | Struck against crucible |
| Shape b | >300 | Absent | Struck against crucible |
| Shape c | 70 | Absent | Struck against crucible |
| Shape d | 75 | Absent | No problem |
| Shape e | 95 | Absent | No problem |

In a case of the shape a having no guide section, a scattering range is as large as 300 mm. In a case of the shape b having a guide section, though being short, a scattering range is also as large as 300 mm. In cases of the shapes c to e having long guide sections, scattering is especially effectively suppressed. As is understood from such facts, it is desirable for a guide section to be present and longer. Furthermore, it is also effective for a guide section to be inclined. In a case without a raw material accumulating section, where a raw material falls through a vertical charging tube directly, melt attachment to a member is more conspicuous than in the case of the shape a and to be concrete, it was recognized to attach a melt to the lower portion and outer surface of a heat shielding member.

An apparatus of the present invention, as described above, can avoid interference with an accessory facility above a crucible by using a vertical charging tube. By causing a raw material falling down in a vertical charging tube to strike against an accumulated raw material located at a site part way downward therein, kinetic energy of the falling raw material is absorbed and melt splashing is alleviated when the raw material is charged into a raw material melt in a crucible even if the raw material in use is in the shapes of lumps. Moreover, since the accumulated raw material serves as a cushion (a shock reducing material), the vertical charging tube is protected mechanically, thereby enabling wear loss and breakage accompanying shock absorption to be prevented.

What is claimed is:

1. A raw material supply apparatus for additionally supplying a granular/lump polycrystalline raw material into a raw material melt in a crucible through a vertical charging tube in single crystal growth by means of a CZ method, the apparatus comprising a raw material accumulating section working such that defined amount of the polycrystalline raw material is accumulated in the raw material accumulating section at a site part way downward in the vertical charging tube and the polycrystalline raw material in excess of the defined amount falls down.

2. The raw material supply apparatus according to claim 1, which is connected to a top chamber of a CZ pulling furnace instead of a pull chamber.

3. The raw material supply apparatus according to claim 1, wherein the vertical charging tube has a tubular guide section guiding a discharged raw material from the raw material accumulating section at the downstream side thereof.

4. The raw material supply apparatus according to claim 1, wherein the vertical charging tube has the raw material accumulating sections at plural sites thereof in the length direction thereof.

5. A raw material supply apparatus, wherein, in single crystal growth by means of a CZ method, when a granular/lump polycrystalline raw material is additionally supplied into a raw material melt in a crucible through a vertically charging tube, the polycrystalline raw material falling down in the vertical charging tube, after striking against the polycrystalline raw material accumulated in the raw material accumulating section, is charged into the crucible.

6. The raw material supply apparatus according to claim 5, wherein the polycrystalline raw material is a lump raw material having a particle diameter of 30 mm or less.

* * * * *